United States Patent
Zolfaghari

(10) Patent No.: US 8,040,996 B2
(45) Date of Patent: Oct. 18, 2011

(54) METHOD AND SYSTEM FOR RF SIGNAL GENERATION UTILIZING A SYNCHRONOUS MULTI-MODULUS DIVIDER

(75) Inventor: Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 671 days.

(21) Appl. No.: 12/192,988

(22) Filed: Aug. 15, 2008

(65) Prior Publication Data

US 2009/0316849 A1     Dec. 24, 2009

Related U.S. Application Data

(60) Provisional application No. 61/073,961, filed on Jun. 19, 2008.

(51) Int. Cl.
*H03D 3/24* (2006.01)
*H04K 3/00* (2006.01)
(52) U.S. Cl. ........................... 375/376; 327/156
(58) Field of Classification Search .................. 375/373, 375/376; 327/147, 156; 455/76, 260
See application file for complete search history.

(56) References Cited

U.S. PATENT DOCUMENTS

| 6,008,703 A * | 12/1999 | Perrott et al. ............. 332/100 |
| 6,219,397 B1 * | 4/2001 | Park ......................... 375/376 |
| 6,803,834 B1 * | 10/2004 | Chen ......................... 331/179 |

* cited by examiner

*Primary Examiner* — Lee Nguyen
(74) *Attorney, Agent, or Firm* — McAndrews, Held & Malloy, Ltd.

(57) ABSTRACT

Aspects of a method and system for RF signal generation utilizing a synchronous multi-modulus divider are provided. In this regard, a feedback signal of a PLL may be generated by clocking a counter with an RF signal output by the PLL and toggling the feedback signal each time a determined value of the counter is reached. Moreover, updates of each register in the counter and transitions of the feedback signal may be synchronous with the RF signal output by the PLL. The PLL may be part of a cellular transmitter and/or receiver which may communicate over an EDGE network. A counting sequence of the counter may be determined, at least in part, by an output of a ΔΣ modulator. In this regard, a first counting sequence may be utilized when an output of the ΔΣ modulator may be asserted and a second counting sequence may be utilized when the output of ΔΣ modulator may be de-asserted.

22 Claims, 6 Drawing Sheets

METHOD AND SYSTEM FOR RF SIGNAL GENERATION UTILIZING A SYNCHRONOUS MULTI-MODULUS DIVIDER

CROSS-REFERENCE TO RELATED APPLICATIONS/INCORPORATION BY REFERENCE

This patent application makes reference to, claims priority to and claims benefit from U.S. Provisional Patent Application Ser. No. 61/073,961 filed on Jun. 19, 2008.

The above stated patent application is hereby incorporated herein by reference in its entirety.

FIELD OF THE INVENTION

Certain embodiments of the invention relate to signal processing. More specifically, certain embodiments of the invention relate to a method and system for RF signal generation utilizing a synchronous multi-modulus divider.

BACKGROUND OF THE INVENTION

With the rapidly increasing dependence on electronic communications and the accompanying efforts to make these communications smaller, faster, and cheaper, the complexity of designing communications systems is also increasing. In this regard, in an effort to develop commercially successful products, electronics designers are continually trying to fit more functionality into smaller and smaller packages. For example, devices which utilize a variety of wireless technologies and/or operate on a plurality of frequencies may be highly desirable but their design may present certain challenges. In particular, it may be difficult to keep the size and cost of such devices low. In this regard, for a device which operates on a plurality of frequencies, generation of accurate and stable frequencies may be important for minimizing interference between signals.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for RF signal generation utilizing a synchronous multi-modulus divider, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for RF signal generation utilizing a synchronous multi-modulus divider. In this regard, a feedback signal of a PLL may be generated by clocking a counter with an RF signal output by the PLL and toggling the feedback signal each time a determined value of the counter is reached. Moreover, updates of each register in the counter and transitions of the feedback signal may be synchronous with the RF signal output by the PLL. The PLL may be part of a cellular transmitter and/or receiver which may communicate over a wireless network with data communication capability such as an EDGE network. A counting sequence of the counter may be determined, at least in part, by an output of a $\Delta\Sigma$ modulator. In this regard, a first counting sequence may be utilized when an output of the $\Delta\Sigma$ modulator may be asserted and a second counting sequence may be utilized when the output of $\Delta\Sigma$ modulator may be de-asserted. In various embodiments of the invention, a value of the counter may be stored in a plurality of flip-flops and updates of contents of the flip-flops may be synchronized to active edges of the RF signal output by the PLL. In this regard, the feedback signal of the PLL may correspond to the contents of one of the plurality of flip-flops. In an exemplary embodiment of the invention, the RF signal output by the PLL may be of a frequency between 1648 MHz and 1910 MHz and the feedback signal of the PLL may be of a frequency between 220 MHz and 250 MHz.

Figure 1A:
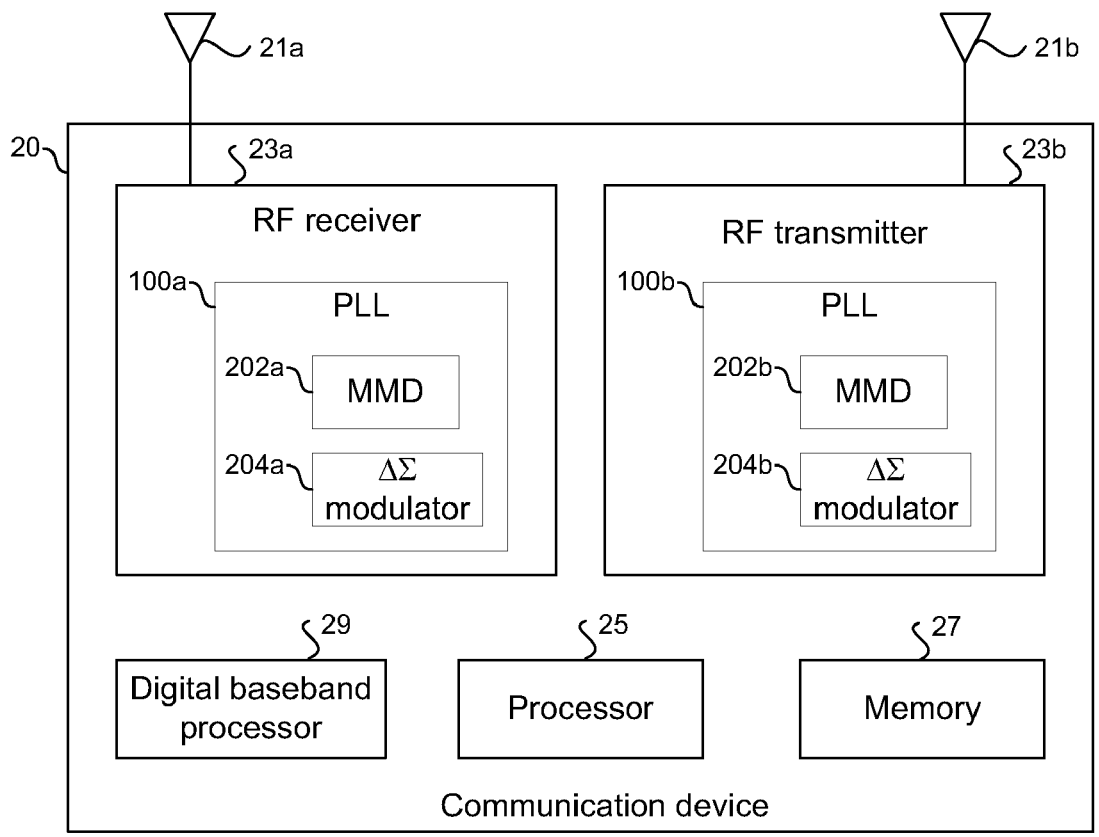
FIG. 1A is a block diagram illustrating an exemplary RF communication device, in accordance with an embodiment of the invention.

FIG. 1A is a block diagram illustrating an exemplary RF communication device, in accordance with an embodiment of the invention. Referring to FIG. 1A, there is shown a RF communication device 20 that may comprise an RF receiver 23a, an RF transmitter 23b, a digital baseband processor 29, a processor 25, and a memory 27. The RF receiver 23a may comprise a PLL 100a. The PLL 100a may comprise a synchronous MMD 202a and a delta sigma ($\Delta\Sigma$) modulator 204a. The RF transmitter 23b may comprise a PLL 100b. The PLL 100b may comprise a synchronous MMD 202b and a delta sigma ($\Delta\Sigma$) modulator 204b. Details of a PLL 100, similar to or the same as the PLLs 100a and 100b, are described below with respect to FIG. 1B. Details of a synchronous MMD 202 similar to or the same as the MMDs 202a and 202b are described below with respect to FIG. 2. Details of a $\Delta\Sigma$ modulator 204 similar to or the same as the $\Delta\Sigma$ modulators 204a and 204b are described below with respect to FIG. 2. A receive antenna 21a may be communicatively coupled to the RF receiver 23a. A transmit antenna 21b may be communicatively coupled to the RF transmitter 23b. The RF communication device 20 may be operated in a system, such as a cellular network (e.g. EDGE) and/or a global navigation satellite system (GNSS) (e.g. GPS) for example. In instances where the RF communication may comprise a GNSS device, the RF transmitter 23b may not be present.

The RF receiver 23a may comprise suitable logic, circuitry, and/or code that may enable processing of received RF signals. For example, the RF receiver may enable receiving cellular signals such as in an EDGE (enhanced data rates for GSM) network. In this regard, the receiver may be enabled to generate signals, such as local oscillator signals, for the reception and processing of RF signals. Accordingly, the RF receiver 23a may comprise the PLL 100a with the synchronous MMD 202a, which may be controlled in part by the ΔΣ modulator 204a, in its feedback path. The RF receiver 23a may down-convert received RF signals to a baseband frequency signal. The RF receiver 23a may perform direct down-conversion of the received RF signal to a baseband frequency signal, for example. In some instances, the RF receiver 23a may enable analog-to-digital conversion of the baseband signal components before transferring the components to the digital baseband processor 29. In other instances, the RF receiver 23a may be operable to transfer the baseband signal components in analog form. In various embodiments of the invention, the RF receiver 23a may be integrated on a semiconductor substrate and may, for example, be referred to as a "system on chip".

The digital baseband processor 29 may comprise suitable logic, circuitry, and/or code that may enable processing and/or handling of baseband frequency signals. In this regard, the digital baseband processor 29 may process or handle signals received from the RF receiver 23a and/or signals to be transferred to the RF transmitter 23b. The digital baseband processor 29 may also provide control and/or feedback information to the RF receiver 23a and to the RF transmitter 23b based on information from the processed signals. In this regard, the baseband processor 29 may provide, for example, the signals 201 and/or 203 (FIG. 2) to the MMD 202 (FIG. 2) and the ΣΔ modulator 204 (FIG. 2), respectively. The digital baseband processor 29 may communicate information and/or data from the processed signals to the processor 25 and/or to the memory 27. Moreover, the digital baseband processor 29 may receive information from the processor 25 and/or to the memory 27, which may be processed and transferred to the RF transmitter 23b for transmission to the network.

The RF transmitter 23b may comprise suitable logic, circuitry, and/or code that may enable processing of RF signals for transmission. In this regard, the transmitter may be enabled to generate signals, such as local oscillator signals, for the transmission and processing of EHF signals. Accordingly, the RF transmitter 23b may comprise a PLL 100b with the synchronous MMD 202b, which may be controlled in part by the ΔΣ modulator 204b, in its feedback path. The RF transmitter 23b may up-convert the baseband frequency signal to an RF signal. The RF transmitter 23b may perform direct up-conversion of the baseband frequency signal to a RF signal of approximately 60 GHz, for example. In some instances, the RF transmitter 23b may enable digital-to-analog conversion of the baseband signal components received from the digital baseband processor 29 before up conversion. In other instances, the RF transmitter 23b may receive baseband signal components in analog form. In various embodiments of the invention, the RF transmitter 23b may be integrated on a semiconductor substrate and may, for example, be referred to as a "system on chip".

The processor 25 may comprise suitable logic, circuitry, and/or code that may enable control and/or data processing operations for the RF communication device 20. The processor 25 may be utilized to control at least a portion of the RF receiver 23a, the RF transmitter 23b, the digital baseband processor 29, and/or the memory 27. In this regard, the processor 25 may generate at least one signal for controlling operations within the RF communication device 20. For example, the baseband processor 29 may provide the signals 201 and/or 203 (FIG. 2) to the MMD 202 (FIG. 2) and the ΣΔ modulator 204 (FIG. 2), respectively. The processor 25 may also enable executing of applications that may be utilized by the RF communication device 20. For example, the processor 25 may execute applications that may enable displaying and/or interacting with content received via RF signals in the RF communication device 20.

The memory 27 may comprise suitable logic, circuitry, and/or code that may enable storage of data and/or other information utilized by the RF communication device 20. For example, the memory 27 may be utilized for storing processed data generated by the digital baseband processor 29 and/or the processor 25. The memory 27 may also be utilized to store information, such as configuration information, that may be utilized to control the operation of at least one block in the RF communication device 20. For example, the memory 27 may comprise information necessary to configure the MMD 202 and/or the ΣΔ modulator 204.

Figure 1B:
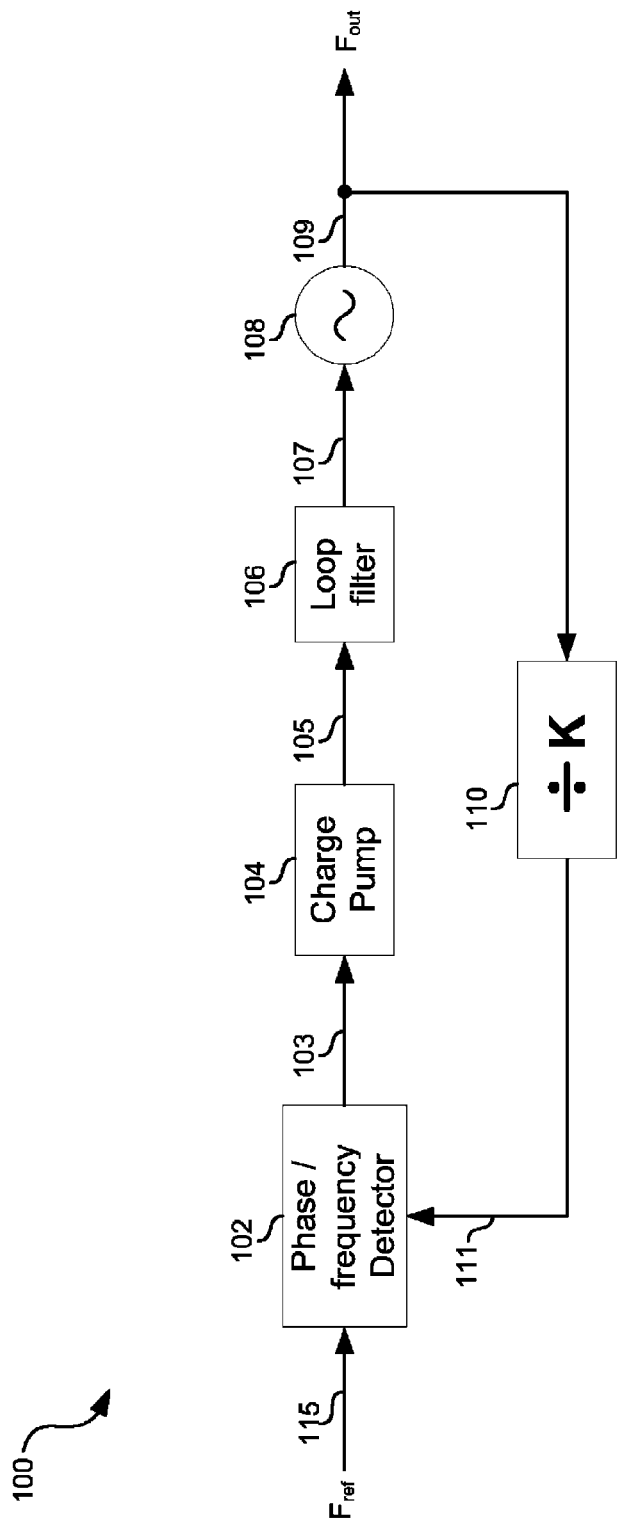
FIG. 1B is a diagram of a phase locked loop (PLL), in accordance with an embodiment of the invention.

FIG. 1B is a block diagram illustrating an exemplary PLL, in accordance with an embodiment of the invention. Referring to FIG. 1B an exemplary PLL 100 may comprise a phase detector 102, a charge pump 104, a loop filter 106, a voltage controlled oscillator (VCO) 108, and a frequency divider 110.

The phase detector 102 may comprise suitable logic, circuitry, and/or code that may enable generating one or more signals based on a phase difference between two signals. In this regard, the signals 111 and 115 may be input to the phase detector 102 and the signal 103 may be output. Accordingly, the signal 103 may be based on a phase difference between the signals 111 and 115.

The charge pump 104 may comprise suitable logic, circuitry, and/or code that may enable adjusting a voltage 105 based on the error signal 103. For example, the charge pump 104 may increase the voltage 105 when the error signal 103 indicates that signal 111 is lagging the signal 115. Similarly, the charge pump 104 may decrease the voltage 105 when the error signal 103 indicates that signal 111 is leading the signal 115.

The loop filter 106 may comprise suitable logic, circuitry, and/or code for low-pass filtering or otherwise conditioning the voltage 105 to provide a control voltage 107 to the VCO 108.

The VCO 108 may comprise suitable logic, circuitry, and/or code that may enable generating a signal 109 based on a control voltage 107. In this regard, the frequency of the signal 109 may be determined, at least in part, by the control voltage 107.

The frequency divider 110 may comprise suitable logic, circuitry, and/or code for receiving a first, higher, frequency and outputting a second, lower, frequency. The scaling factor, K, may be determined based on one or more control signals from, for example, the processor 25 of FIG. 5. The scaling factor K may be an integer or a fraction.

In operation the PLL 100 may generate a signal 109 of variable frequency which has the stability of the fixed frequency reference signal 115. In this regard, the output signal 109 may be divided down in frequency to generate the signal 111 which may be equal in frequency to the reference signal 115. Accordingly, the output signal 109 may be any integer or fractional multiple of the reference signal 115. In this regard, the signal 111 may be determined by the following relationship:

$$f_{111} = f_{109}/K \qquad \text{EQ. 1}$$

where $f_{111}$ is the frequency of the signal 111, $f_{109}$ is the frequency of the signal 109, and 1/K is the divide ratio of the frequency divider 108. Accordingly, the PLL 100 may be enabled to generate a wide range of frequencies. However, the range, stability, and/or resolution of frequencies that the PLL 100 may generate may be limited by the divider 110. In this regard, it may be desirable to provide a low-cost and low complexity frequency divider 110, which provides stable feedback signals 111 when clocked at ultra high (UHF) frequencies such as 1648 MHz to 1910 MHz, and higher.

Figure 2:
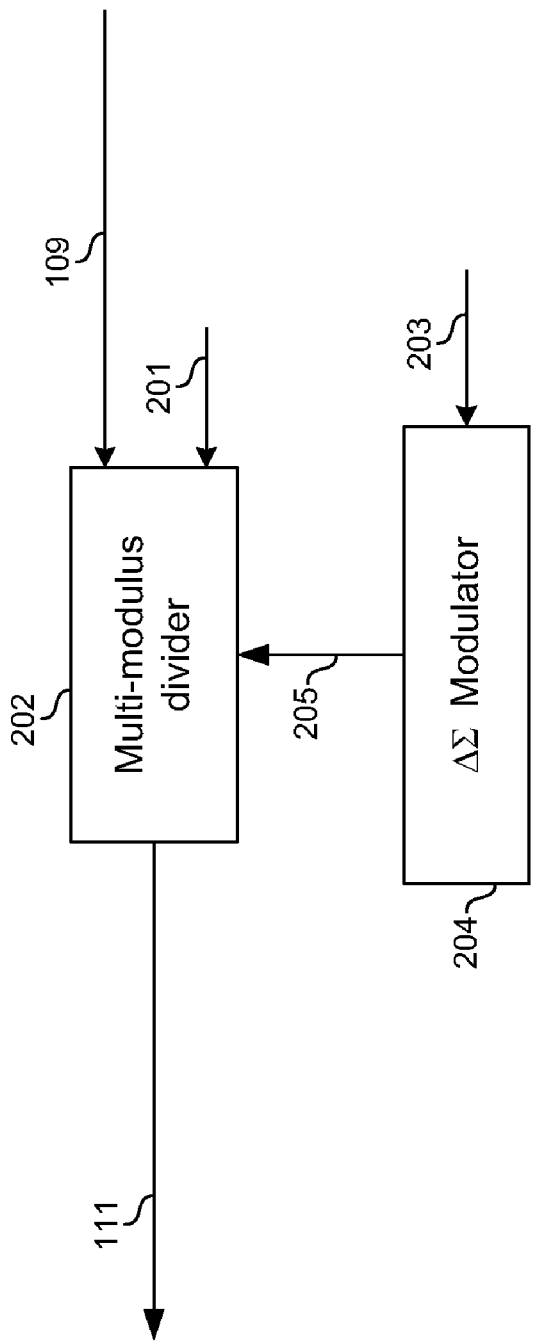
FIG. 2 is a diagram illustrating a PLL with synchronous multi-modulus divider, in accordance with an embodiment of the invention.

FIG. 2 is a diagram illustrating a PLL feedback path, in accordance with an embodiment of the invention. Referring to FIG. 2 there is shown a multi-modulus divider (MMD) 202 and a ΔΣ modulator 204.

The MMD 202 may comprise suitable logic, circuitry, and/or code for receiving a signal 109 having a first, higher, frequency $f_{109}$ and outputting signal 111 having a second, lower, frequency $f_{111}$.

The sigma delta (ΔΣ) modulator 204 may comprise suitable logic, circuitry, and/or code for generating the signal 205 to control the scaling factor of the MMD 204.

In operation, the MMD 202 may achieve integer and/or fractional scaling factors. A fractional scaling factor 'K' may be achieved by dividing by 'M' for a portion of time and 'M+1' for a portion of time, where 'M'<'K'<'M+1' and 'M' is an integer. The input signal 109 may be divided by 'M' when the signal 205 is de-asserted and the input signal 109 may be divided by 'M+1' when the signal 205 is asserted. Accordingly, the scaling factor may be determined by the following relationship:

$$K_T = \frac{t_{hi} * (M+1)}{t_{lo} * (M)} \qquad \text{EQ. 1}$$

where '$K_T$' may be the scaling factor over the time interval 'T', '$t_{hi}$' may be the percentage of the time interval 'T' that signal 205 may be asserted, and '$t_{lo}$' may be the percentage of the time interval 'T' that signal 205 may be de-asserted. Thus, the output frequency '$f_{111}$' may be determined by the following relationship:

$$f_{111} = f_{109}/K_T \qquad \text{EQ. 2}$$

where '$f_{111}$' may be the time averaged frequency of the feedback signal 111 over the time interval 'T', and '$f_{109}$' may be the time averaged frequency of the input signal 109 over the time interval 'T'. Additionally, the output of the MMD 202 may be synchronized to the input signal 109 such that signal 111 may be applied directly to a phase detector, such as the phase detect 104, without requiring retiming or resynchronization to the signal 109.

The modulus 'M' may be controlled by the signal 201 received from a processor, such as the processors 25 or 29 described with respect to FIG. 5. Furthermore, the ΔΣ modulator 204 may control $t_{hi}$ and/or $t_{low}$ based on the signal 203 received from a processor, such as the processors 25 or 29. In this regard, if the signal 205 were to have a fixed period, spurs may arise at the output of a PLL comprising the MMD 202. Accordingly, the ΔΣ modulator 204 may randomize the signal 205 such that the desired '$t_{hi}$' and $t_{low}$ may be achieved without signal 205 having a fixed period.

Figure 3A:
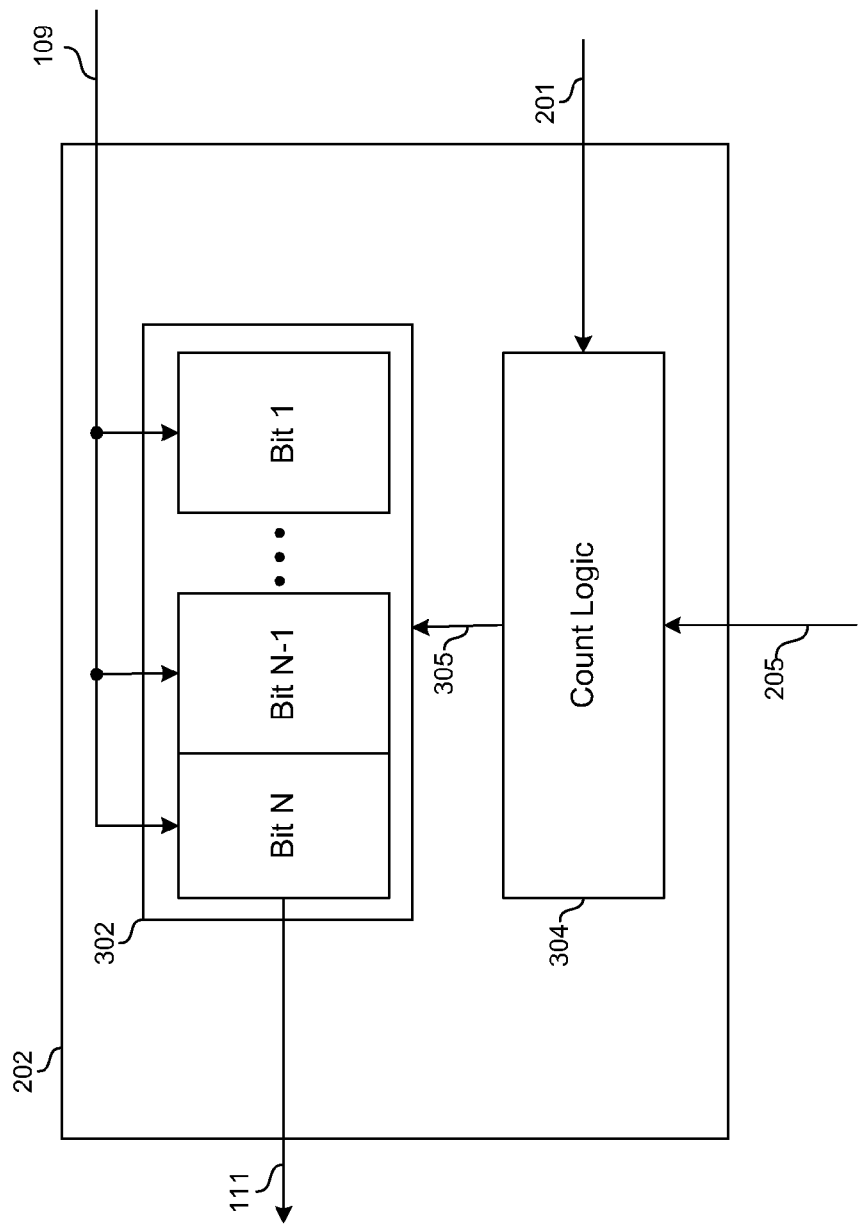
FIG. 3A is a diagram of a synchronous multi-modulus divider, in accordance with an embodiment of the invention.

FIG. 3A is a diagram of a synchronous multi-modulus divider, in accordance with an embodiment of the invention. Referring to FIG. 3A, the MMD 202 may be a synchronous counter comprising an N-bit register 302 and count logic 304.

The N-bit register 302 may comprise 'N' flip-flops. The 'N' flip-flops may each comprise a clock input communicatively coupled to the signal 109. In this manner, transitions and/or updating of the contents of each flip-flop may be triggered on an active edge of the signal 109. Accordingly, independent of the scaling factor 'K', the output signal 111 may remain synchronized with the input signal 109.

The count logic 304 may comprise logic for controlling the state of the N-bit register 302 to generate the signal 111 based on the signal 109. The count logic 304 may be configured based on the signal 201. In this regard, the count logic 304 may determine the value of 'M' based on the signal 201.

In operation, the control logic 304 may be operable to update the contents of the register 304 on each active edge of the signal 109. In instances that the signal 205 may be asserted, the control logic 304 may utilize the register 302 to count 'M+1' cycles of the signal 109 between transitions of the signal 111. In instances that the signal 205 may be de-asserted, the control logic 304 may utilize the register 302 to count 'M' cycles of the signal 109 between transitions of the signal 111.

In an exemplary embodiment of the invention, the MMD 202 may be utilized to achieve a scaling factor of 7.5. Accordingly, the count logic 304 may be configured such that 'M' may be 7 and the signal 109 may be divided by 7 half of the time and divided by 8 the other half of the time.

To divide by 8, the count logic 304 and the register 302 may operate as a 3-bit up-counter, with each count being triggered on an active edge of the signal 109. In this regard, the MMD 202 may count from 0 (000b) to 7 (111b) and upon reaching 7 (111b) the next active edge of the signal 109 may wrap the count back to 0 (000b). Accordingly, the $3^{rd}$ bit of the register 302 may toggle on every 8 cycles of the signal 109 and thus the $3^{rd}$ bit of the register may be output as the signal 111.

Division by 7 may be performed in a similar manner, but the count logic 304 may cause one value between 0 (000b) and 7 (111b) to be skipped such that the $3^{rd}$ bit of the register 302 may toggle every 7 cycles of the signal 109. For example, in counting from 0 (000b) to 7 (111b), the value 2 (010b) may be skipped.

Figure 3B:
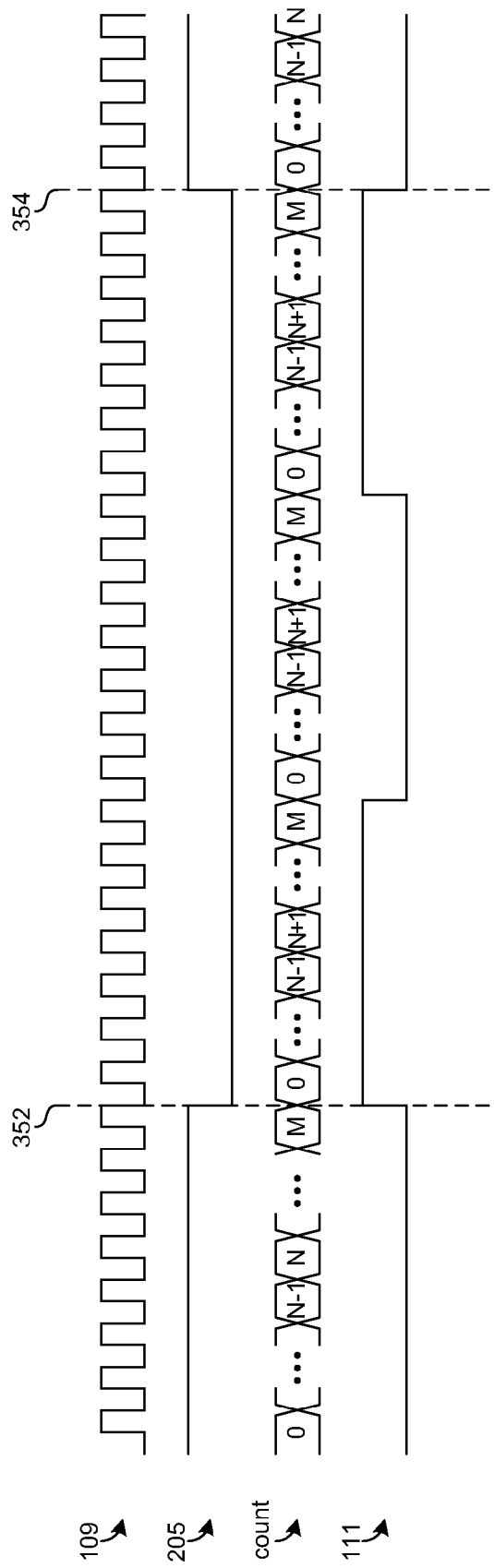
FIG. 3B is a timing diagram illustrating exemplary generation of a PLL feedback signal utilizing a synchronous counter, in accordance with an embodiment of the invention.

FIG. 3B is a timing diagram illustrating exemplary generation of a PLL feedback signal utilizing a synchronous counter, in accordance with an embodiment of the invention. Referring to FIG. 3B there is shown exemplary waveforms for the output signal 109, the control signal 201, the count of the register 302, and the feedback signal 111.

Prior to time 352, the signal 305 from the ΣΔ modulator 204 may be asserted and thus the MMD 202 may divide by 'M+1'. Accordingly, the counting sequence during this time interval may comprise each integer from 0 to 'M' and after 'M' the count may wrap back to 0.

From time 352 to time 354, the signal 205 from the ΣΔ modulator 204 may be de-asserted and thus the MMD 202 may divide by 'M'. Accordingly, the counting sequence during this time interval may comprise each integer from 0 to N−1 and each integer from N+1 to M. After 'M' the count may wrap back to 0. In this regard, an integer 'N', for example 2, may be skipped in instances that the signal 205 may be de-asserted.

In an exemplary embodiment of the invention, the signal 109 may have frequency between approximately 1648 MHz and 1910 MHz and the feedback signal 111 may have frequency between approximately 220 MHz and 250 MHz. In this regard, 'M' may be 7 and 'K' may be 7.5.

Figure 4:
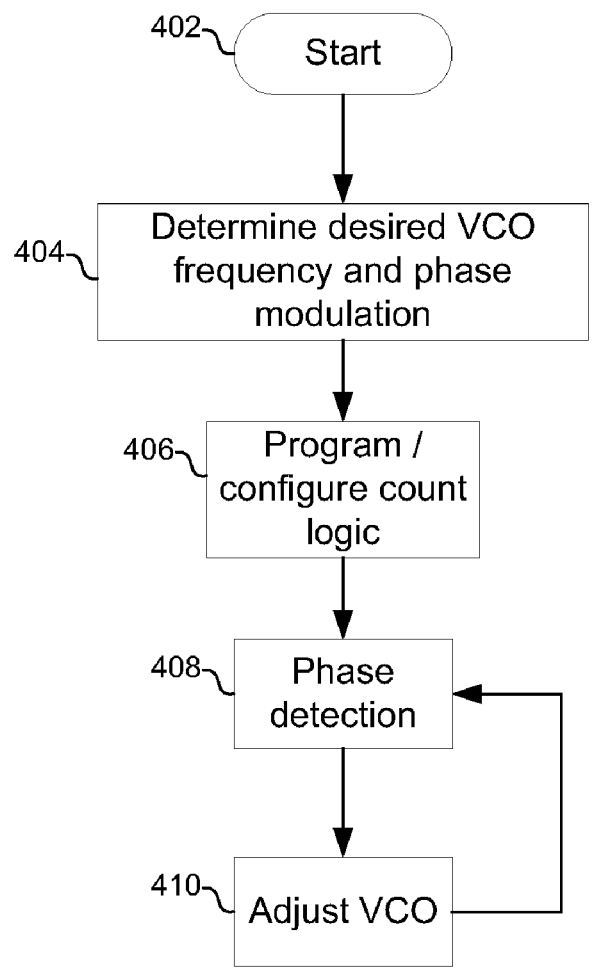
FIG. 4 is a flow chart illustrating exemplary steps for RF signal generation via a synchronous MMD in a feedback loop of a PLL, in accordance with an embodiment of the invention.

FIG. 4 is a flow chart illustrating exemplary steps for RF signal generation via a synchronous MMD in a feedback loop of a PLL, in accordance with an embodiment of the invention. Referring to FIG. 4, the exemplary steps may begin with start step 402. Subsequent to start step 402, the exemplary steps may advance to step 404. In step 404, a desired frequency and phase modulation of the VCO 108 may be determined. In this regard, in instances that the PLL 100 may be utilized to transmit or receive RF signals, the output of the VCO 108 may be determined based on the RF transmit and/or RF receive frequency. Subsequent to step 404, the exemplary steps may advance to step 406.

In step 406, the scaling factor 'K' may be determined, for example, by the processor 25 and/or the baseband processor 29, utilizing EQ. 2 above. In this regard, for different values of the reference frequency 115 and/or the desired output frequency 109, the value of the 'K' word may be adjusted. Furthermore, once 'K' is determined, the value of 'M' may be configured in the count logic 304 via the signal 201 and $t_{hi}$ and/or $t_{low}$ may be configured in the $\Sigma\Delta$ modulator 204 via the signal 203. Subsequent to step 406, the exemplary steps may advance to step 408.

In step 408, a phase difference between the signal 111 and the signal 115 may be determined. Subsequent to step 408, the exemplary steps may advance to step 410. In step 410, the VCO 108 may be adjusted based on the phase difference between the signals 111 and 115. For example, the voltage across a varactor may be adjusted to increase or decrease the output frequency of the VCO 108, such that the phase difference between the signals 111 and 115 may be reduced. Accordingly, when there may be no phase difference between the signals 111 and 115 the PLL may be said to be "locked". Subsequent to step 410, the exemplary steps may return to step 408. In this regard, maintaining phase lock may be a continuous process that requires periodic or even constant feedback.

Exemplary aspects of a method and system for RF signal generation utilizing a synchronous multi-modulus divider are provided. In this regard, a feedback signal 111 of a PLL 100 may be generated by clocking a counter with an RF signal 109 output by the PLL 100 and toggling the feedback signal 111 each time a determined value of the counter 202 is reached. Moreover, updates of each register 302 in the counter 202 and transitions of the feedback signal 111 may be synchronous with the RF signal 109 output by the PLL 100. The PLL 100 may be part of a cellular transmitter 23a and/or receiver 23b which may communicate over a network with data communication capabilities, such as an EDGE network. A counting sequence of the counter 202 may be determined, at least in part, by an output of the $\Delta\Sigma$ modulator 204. In this regard, a first counting sequence may be utilized when an output 205 of the $\Delta\Sigma$ modulator 204 is asserted and a second counting sequence may be utilized when the output 205 of $\Delta\Sigma$ modulator 204 is de-asserted. In various embodiments of the invention, a value of the counter 202 may be stored in a plurality of flip-flops and updates of contents of the flip-flops may be synchronized to active edges of the RF signal 109 output by the PLL 100. In this regard, the feedback signal 111 of the PLL 100 may correspond to the contents of one of the plurality of flip-flops. In an exemplary embodiment of the invention, the RF signal 109 output by the PLL 100 may be of a frequency between 1648 MHz and 1910 MHz and the feedback signal 111 of the PLL 100 may be of a frequency between 220 MHz and 250 MHz.

Another embodiment of the invention may provide a machine-readable storage, having stored thereon, a computer program having at least one code section executable by a machine, thereby causing the machine to perform the steps as described herein for RF signal generation utilizing a synchronous multi-modulus divider.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
   in a phase locked loop fabricated on a semiconductor substrate, generating a feedback signal by clocking a synchronous counter with an output RF signal from said phase locked loop; and
   toggling said feedback signal each time a determined value of said synchronous counter is reached, wherein updates of each register in said counter and transitions of said feedback signal are synchronous with said output RF signal from said phase locked loop.

2. The method according to claim 1, wherein said phase locked loop is part of a cellular transmitter and/or receiver.

3. The method according to claim 2, wherein said cellular transmitter and/or receiver enables communication over an EDGE network.

4. The method according to claim 1, comprising determining a counting sequence of said synchronous counter based on a plurality of control signals.

5. The method according to claim 4, wherein one or more of said plurality of control signals is an output of a sigma delta modulator.

6. The method according to claim 5, wherein a first of said counting sequence is utilized when said output of said sigma delta modulator is asserted and a second of said counting sequence is utilized when said output of said delta sigma modulator is utilized.

7. The method according to claim 1, wherein a value of said synchronous counter is stored in a plurality of flip-flops and updates of contents of said flip-flops are synchronized to active edges of said RF signal output by said phase locked loop.

8. The method according to claim 7, wherein said feedback signal corresponds to said contents of one of said plurality of flip-flops.

9. The method according to claim 1, wherein a frequency of said RF signal output by said phase locked loop is between 1648 MHz and 1910 MHz.

10. The method according to claim 1, wherein a frequency of said feedback signal is between 220 MHz and 250 MHz.

11. The method according to claim 1, wherein said feedback signal is communicatively coupled to a phase detector in said phase locked loop without any additional resynchronization or retiming.

12. A system for signal processing, the system comprising:
one or more circuits fabricated on a semiconductor substrate, said one or more circuits comprising a phase locked loop and a synchronous counter, said one or more circuits being operable to generate a feedback signal by clocking said synchronous counter with an output RF signal from said phase locked loop; and
said one or more circuits being operable to toggle said feedback signal each time a determined value of said synchronous counter is reached, wherein updates of each register in said synchronous counter and transitions of said feedback signal are synchronous with said output RF signal from said phase locked loop.

13. The system according to claim 12, wherein said phase locked loop is part of a cellular transmitter and/or receiver.

14. The system according to claim 13, wherein said cellular transmitter and/or receiver enables communication over an EDGE network.

15. The system according to claim 12, wherein said one or more circuits are operable to determine a counting sequence of said synchronous counter based on a plurality of control signals.

16. The system according to claim 15, wherein one or more of said plurality of control signals is an output of a delta sigma modulator.

17. The system according to claim 16, wherein a first of said counting sequence is utilized when said output of said sigma delta modulator is asserted and a second of said counting sequence is utilized when said output of said delta sigma modulator is utilized.

18. The system according to claim 12, wherein a value of said synchronous counter is stored in a plurality of flip-flops and updates of contents of said flip-flops are synchronized to active edges of said RF signal output by said phase locked loop.

19. The system according to claim 18, wherein said feedback signal corresponds to said contents of one of said plurality of flip-flops.

20. The system according to claim 12, wherein a frequency of said RF signal output by said phase locked loop is between 1648 MHz and 1910 MHz.

21. The system according to claim 12, wherein a frequency of said feedback signal is between 220 MHz and 250 MHz.

22. The system according to claim 12, wherein said feedback signal is communicatively coupled to a phase detector in said phase locked loop without any additional resynchronization or retiming.

* * * * *